United States Patent
Lee et al.

(10) Patent No.: US 8,350,279 B2
(45) Date of Patent: Jan. 8, 2013

(54) LIGHT EMITTING DIODE HAVING ALINGAP ACTIVE LAYER AND METHOD OF FABRICATING THE SAME

(75) Inventors: Chung Hoon Lee, Gwangmyeong-si (KR); Jae Ho Lee, Yongin-si (KR); Mi Hae Kim, Suwon-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 521 days.

(21) Appl. No.: 12/442,511

(22) PCT Filed: Sep. 4, 2007

(86) PCT No.: PCT/KR2007/004241
§ 371 (c)(1),
(2), (4) Date: Mar. 23, 2009

(87) PCT Pub. No.: WO2008/038910
PCT Pub. Date: Apr. 3, 2008

(65) Prior Publication Data
US 2009/0272991 A1  Nov. 5, 2009

(30) Foreign Application Priority Data

Sep. 25, 2006 (KR) .......... 10-2006-0092828
Sep. 27, 2006 (KR) .......... 10-2006-0094243

(51) Int. Cl.
*H01L 29/26* (2006.01)
*H01L 29/22* (2006.01)

(52) U.S. Cl. .......... 257/98; 257/103

(58) Field of Classification Search .......... 257/88, 257/79, 103, E29.143, E33.064, 98
See application file for complete search history.

(56) References Cited

U.S. PATENT DOCUMENTS

| 5,008,718 A | 4/1991 | Fletcher et al. |
| 5,233,204 A | 8/1993 | Fletcher et al. |

(Continued)

FOREIGN PATENT DOCUMENTS

JP  2006-210949  8/2006

(Continued)

OTHER PUBLICATIONS

Taiwanese Preliminary Notice of the First Office Action dated Jan. 24, 2011 on TW Application No. 096134849, which corresponds to U.S. Appl. No. 12/442,511.

*Primary Examiner* — Hung Vu
(74) *Attorney, Agent, or Firm* — H.C. Park & Associates, PLC (57) ABSTRACT

A light emitting diode having an AlInGaP active layer and a method of fabricating the same are disclosed. The light emitting diode includes a substrate. A plurality of light emitting cells are positioned to be spaced apart from one another, wherein each of the light emitting cells has a first conductive-type lower semiconductor layer, an AlInGaP active layer and a second conductive-type upper semiconductor layer. Meanwhile, a semi-insulating layer is interposed between the substrate and the light emitting cells. Further, wires connect the plurality of light emitting cells in series. Accordingly, it is possible to provide a light emitting diode, in which a plurality of light emitting cells are connected in series to one another through wires to be driven by an AC power source.

13 Claims, 5 Drawing Sheets

U.S. PATENT DOCUMENTS

| | | |
|---|---|---|
| 5,376,580 A | 12/1994 | Kish et al. |
| 5,502,316 A | 3/1996 | Kish et al. |
| 5,936,599 A | 8/1999 | Reymond |
| 6,420,732 B1 | 7/2002 | Kung et al. |
| 6,998,642 B2 * | 2/2006 | Lin et al. .......................... 257/79 |
| 2004/0046510 A1 | 3/2004 | Allen |
| 2004/0075399 A1 | 4/2004 | Hall |
| 2004/0201988 A1 | 10/2004 | Allen |
| 2006/0169993 A1 | 8/2006 | Fan et al. |

FOREIGN PATENT DOCUMENTS

| | | |
|---|---|---|
| KR | 10-2006-0037589 | 5/2006 |
| KR | 10-2006-0100638 | 9/2006 |
| TW | 2005-12952 | 1/2005 |
| TW | I234297 | 6/2005 |
| TW | 2005-35195 | 11/2005 |
| WO | 2004-070851 | 8/2004 |
| WO | 2006-083065 | 8/2006 |
| WO | 2006-095949 | 9/2006 |

\* cited by examiner

LIGHT EMITTING DIODE HAVING ALINGAP ACTIVE LAYER AND METHOD OF FABRICATING THE SAME

CROSS REFERENCE TO RELATED APPLICATIONS

This application is the National Stage of International Application No. PCT/KR2007/004241, filed Sep. 4, 2007, and claims priority from and the benefit of Korean Patent Application No. 10-2006-0092828, filed on Sep. 25, 2006, and Korean Patent Application No. 10-2006-0094243, filed on Sep. 27, 2006, which are all hereby incorporated by reference for all purposes as if fully set forth herein.

BACKGROUND OF THE INVENTION

1. Field of the Invention

The present invention relates to a light emitting diode, and more particularly, to a light emitting diode having an AlInGaP active layer and a method of fabricating the same.

2. Discussion of the Background

A light emitting diode (LED), which is a photoelectric conversion semiconductor device having a structure in which an n-type semiconductor of which majority carriers are electrons and a p-type semiconductor of which majority carriers are holes are joined together, emits light through recombination of these electrons and holes. In particular, an AlInGaP compound semiconductor has been applied to a high-quality semiconductor laser for emitting light with a wavelength of about 670 nm. Further, the AlInGaP compound semiconductor has been applied to an LED for emitting light in a wavelength range of 560 to 680 nm by adjusting a ratio of Al and Ga.

Figure 1:
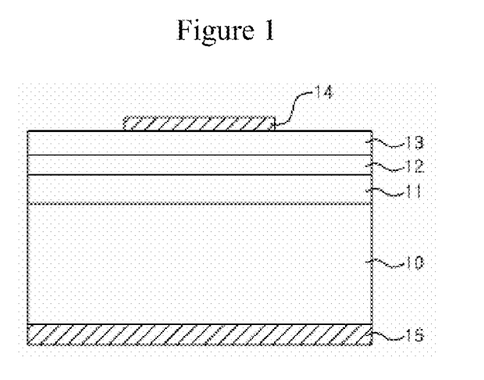
FIG. 1 is a sectional view illustrating a conventional LED having an AlInGaP active layer.

FIG. 1 is a sectional view of a conventional LED having an AlInGaP active layer.

Referring to FIG. 1, an N-type AlInGaP lower semiconductor layer 11 is grown on an N-type GaAs substrate 10, and an AlInGaP active layer 12 is grown on the N-type AlInGaP lower semiconductor layer 11. Subsequently, a P-type AlInGaP upper semiconductor layer 13 is grown on the AlInGaP active layer 12. These semiconductor layers may be grown through various methods, e.g., methods including a metal organic chemical vapor deposition (MOCVD) or molecular beam epitaxy (MBE). Then, an electrode 14 is formed on the upper semiconductor layer 13, and an electrode 15 is formed on a rear surface of the substrate 10.

The lower and upper semiconductor layers 11 and 13, which are confining layers for helping electrons and holes to be recombined in the active layer 12, are formed of a material having a larger bandgap as compared with the active layer 12.

Since the LED is fabricated by growing AlInGaP epitaxial layers on a conductive substrate, the electrode 15 is formed on the rear surface of the substrate to thereby drive the LED.

Meanwhile, since the electrode 14 is formed on the upper semiconductor layer 13 of which the specific resistivity is high, the LED has a problem of current distribution. To solve such a problem, technologies for employing a transparent window layer with low specific resistivity have been disclosed in U.S. Pat. Nos. 5,008,718 and 5,233,204. According to the documents, a window layer with low specific resistivity, e.g., a GaAsP, AlGaAs or GaP layer, is grown on the upper semiconductor layer 13 for the purpose of uniform current distribution, thereby improving the light emitting efficiency.

Further, in U.S. Pat. Nos. 5,376,580 and 5,502,316, after growing AlInGaP epitaxial layers on a light absorptive substrate such as a GaAs substrate, the substrate is separated from the epitaxial layers, and the epitaxial layers are bonded to a light transmissive substrate such as GaP, thereby improving the light emitting efficiency.

However, since an LED emits light by a forward current, the conventional LED is repeatedly turned on/off depending on current directions when the conventional LED is connected to an AC power source and is then operated. Hence, additional components such as a converter for converting AC into DC are required in order to use the conventional LED by being directly connected to the AC power source. Such additional components make it difficult to substitute an LED for a conventional fluorescent lamp due to their incidental expenses.

SUMMARY OF THE INVENTION

An object of the present invention is to provide an AlInGaP LED which can be driven by being connected to an AC power source without an AC-to-DC converter, and a method of fabricating the AlInGaP LED.

Another object of the present invention is to provide an AlInGaP LED wherein a conventional conductive substrate can be used as an epitaxial growth substrate as it is.

A further object of the present invention is to provide an AlInGaP LED which can be driven by being connected to an AC power source without an AC-to-DC converter and have enhanced current distribution performance, and a method of fabricating the AlInGaP LED.

A still further object of the present invention is to provide an AlInGaP LED which can prevent light from being absorbed into a substrate and have the enhanced light emitting efficiency, and a method of fabricating the AlInGaP LED.

In order to achieve the objects, the present invention provides an LED having an AlInGaP active layer and a method of fabricating the same. The LED according to an aspect of the present invention includes a substrate. A plurality of light emitting cells are disposed on the substrate to be spaced apart from one another. Each of the light emitting cells comprises a first conductive-type lower semiconductor layer, an AlInGaP active layer and a second conductive-type upper semiconductor layer. Meanwhile, semi-insulating layers are interposed between the substrate and the light emitting cells. Further, wires connect the plurality of light emitting cells in series. The semi-insulating layers electrically insulate each of the plurality of light emitting cells from the substrate. Meanwhile, since the wires connect the plurality of light emitting cells in series, an array of the light emitting cells connected in series is formed. It is possible to provide an LED which can be driven under an AC power source using such arrays.

Here, the "semi-insulating" layer generally refers to a high-resistance material layer with high specific resistivity of about $10^5$ Ω·cm or more at a normal temperature, and includes insulative material layer if there is no specific reference thereto. Meanwhile, first and second conductive types respectively denote N and P types, or P and N types.

The semi-insulating layers may extend to be continuous. Since the semi-insulating layer has a high resistance, the continuous semi-insulating layer does not influence the operation of the light emitting device. Moreover, since the semi-insulating layers need not be separated from one another, a process of fabricating light emitting cells can be simplified.

In addition, the substrate may be a growth substrate for growing epitaxial layers including an AlInGaP active layer. In this case, the substrate may be a conductive substrate, e.g., a GaAs substrate. The GaAs substrate is suitable for growing the AlInGaP epitaxial layers and helps the growth of an AlIn- GaP active layer with superior internal quantum efficiency. Alternatively, the substrate may be a base substrate to which epitaxial layers including an AlInGaP active layer previously grown on a sacrificial substrate such as a GaAs substrate. In this case, the substrate may be appropriately selected from substrates that satisfy a required characteristic, e.g., high thermal conductivity, transmissivity or the like.

The lower and upper semiconductor layers are formed of a material with a bandgap larger than the AlInGaP active layer to help electrons and holes to be recombined. Further, the semi-insulating layer may be formed of a III-V based material doped with electron acceptors, and the electron acceptor may be an alkali metal, an alkali earth metal and/or a transition metal. In particular, the electron acceptor may be iron (Fe).

Meanwhile, each of the plurality of light emitting cells may further include a window layer positioned on the upper semiconductor layer. The window layer is formed of a transparent material with low specific resistivity, and improves current distribution in each of the light emitting cells. The window layer may be formed of GaAsP, AlGaAs, GaP, or the like. Further, the window layer may be formed of a material with a bandgap broader than the AlInGaP active layer. However, in order to reduce forward voltage (Vf), the window layer may be formed of a material with the same bandgap as the active layer. Meanwhile, the window layer may be grown using an epitaxial growth technique.

In some embodiments of the present invention, the light emitting cells are connected though the wires to form at least two serial arrays, and the serial arrays may be connected in reverse parallel. It is possible to provide an LED which can be continuously operated under an AC power source using the serial arrays connected in reverse parallel. In some embodiments of the present invention, light emitting cells for a bridge rectifier connected to the light emitting cells connected in series may be positioned on the substrate. The light emitting cells connected in series can be operated under an AC power source by the light emitting cells for a bridge rectifier.

Meanwhile, in some embodiments of the present invention, the LED may further include a plurality of metal patterns spaced apart from one another on the substrate. In this case, the semi-insulating layer may be interposed between the substrate and the metal patterns, and the plurality of light emitting cells may be positioned on the metal patterns, respectively. Current distribution performance in each of the light emitting cells is enhanced by means of the metal patterns.

Each of the metal patterns may include an adhesive metal layer and a reflective metal layer. The adhesive metal layer enhances the adhesion between the light emitting cells and the substrate, and the reflective metal layer reflects light directed toward the substrate from the light emitting cells. Accordingly, the reflective metal layer prevents light loss due to the light absorption of the substrate, thereby improving light emitting efficiency.

Further, in each of the light emitting cells, the active layer and the upper semiconductor layer may be positioned on a portion of the lower semiconductor layer such that a region of the lower semiconductor layer can be exposed. Each wire electrically connects the exposed region of the lower semiconductor layer of the light emitting cell and the upper semiconductor layer of the adjacent light emitting cell thereto. Alternatively, each of the light emitting cells may be positioned on a portion of the metal pattern such that a region of the metal pattern can be exposed, and each wire may electrically connect the exposed region of the metal pattern and the upper semiconductor layer of the light emitting cell adjacent thereto. Accordingly, when the wires are formed of metal, the contact resistance of the wires is reduced.

According to another aspect of the present invention, there is provided a method of fabricating an LED having an AlInGaP active layer. The method of fabricating an LED according to an embodiment of the present invention includes forming a buffer layer that is a semi-insulating layer on a substrate. Thereafter, semiconductor layers are formed on the semi-insulating buffer layer, wherein the semiconductor layers include first and second conductive-type semiconductor layers and an AlInGaP active layer interposed therebetween. Subsequently, the semiconductor layers are patterned to form a plurality of light emitting cells spaced apart from one another. Each of the light emitting cells comprises the patterned first conductive-type lower semiconductor layer, AlInGaP active layer and second conductive-type upper semiconductor layer. Meanwhile, wires are formed to connect the light emitting cells in series. Accordingly, an LED capable of being driven under an AC power source without an AC-to-DC converter can be fabricated.

A method of fabricating an LED according to another embodiment of the present invention includes forming semiconductor layers on a sacrificial substrate, wherein the semiconductor layers include first and second conductive-type semiconductor layers and an AlInGaP active layer interposed therebetween. Meanwhile, an insulating layer is formed on a base substrate that is different from the sacrificial substrate. Thereafter, the insulating layer and the semiconductor layers are bonded to each other, and the sacrificial substrate is separated from the semiconductor layers. Then, the semiconductor layers are patterned to form a plurality of light emitting cells spaced apart from one another. Each of the light emitting cells comprises the patterned first conductive-type lower semiconductor layer, AlInGaP active layer and second conductive-type upper semiconductor layer. Meanwhile, wires are formed to connect the light emitting cells in series. Accordingly, it is possible to fabricate an LED which can be driven under an AC power source without an AC-to-DC converter. Further, since the light emitting cells are electrically insulated from the base substrate by the insulating layer, a light transmissive substrate and/or conductive substrate with high thermal conductivity can be employed as the base substrate, thereby improving light emitting efficiency of the LED.

Although the sacrificial substrate may be separated after bonding the insulating layer and the semiconductor layers, the present invention is not limited thereto, but it may be performed before bonding the semiconductor layers. In this case, the insulating layer may be bonded to the semiconductor layer positioned on a surface separated from the sacrificial substrate. Further, after bonding another sacrificial substrate to the semiconductor layers, the sacrificial substrate is removed and the insulating layer of the base substrate may be bonded to the semiconductor layers. Thereafter, the other sacrificial substrate is separated.

Meanwhile, the patterning of the semiconductor layers may be performed such that a region of each patterned first conductive-type lower semiconductor layer is exposed. Hence, the wires are connected to the exposed regions of the first conductive-type lower semiconductor layers.

Meanwhile, the bonding of the insulating layer and the semiconductor layers may be performed by interposing an adhesive metal layer therebetween. The adhesive metal layer is patterned, thereby forming metal patterns spaced apart from one another. Hence, the light emitting cells are disposed on the adhesive metal layer, so that current distribution in each light emitting cell is improved.

In addition, a reflective metal layer may be formed on the semiconductor layers before bonding the insulating layer and the semiconductor layers. The reflective metal layer is patterned together with the adhesive metal layer, thereby forming the metal patterns. Accordingly, since light directed toward the base substrate from the light emitting cells is reflected from the reflective metal layer and then emitted to the outside, it is possible to reduce light loss due to light absorption of the base substrate and to employ an opaque substrate as the base substrate.

The adhesive metal layer may be formed on the insulating layer and/or the semiconductor layers to be interposed between the insulating layer and the semiconductor layers. In particular, when the reflective metal layer is formed on the semiconductor layers, the adhesive metal layer may be formed on the reflective metal layer. Accordingly, it is possible to prevent the reflective metal layer from being deteriorated through a bonding process.

Meanwhile, each of the plurality of light emitting cells may further include a window layer positioned on the second conductive-type upper semiconductor layer. The window layer improves current distribution, thereby enhancing light emitting efficiency of the LED. The window layer may be grown through an epitaxial growth technique. Further, the window layer may be formed of a material with a bandgap broader than the AlInGaP active layer. However, in order to reduce forward voltage (Vf), the window layer may be formed of a material with the same bandgap as the active layer.

In this specification, the "lower semiconductor layer" and "upper semiconductor layer" mean relative positions placed on a resultant substrate of an LED with respect to the resultant substrate.

According to embodiments of the present invention, it is possible to provide an LED which can be driven by being connected directly to an AC power source without an AC-to-DC converter and employ a semi-insulating layer to thereby electrically insulate a plurality of light emitting cells from a conductive substrate. Therefore, it is possible to provide an LED having an AlInGaP active layer, which can be driven under an AC power source using a conventional conductive substrate as it is. Meanwhile, in some embodiments of the present invention, it is possible to provide an AlInGaP LED which can be driven by being connected directly to an AC power source without an AC-to-DC converter and have enhanced current distribution performance. It is also possible to provide an AlInGaP LED wherein a sacrificial layer used in growing epitaxial layers is separated and a base substrate with superior optical characteristics is used to thereby prevent light from being absorbed into the substrate and improve light emitting efficiency.

DETAILED DESCRIPTION OF THE ILLUSTRATED EMBODIMENTS

Hereinafter, preferred embodiments of the present invention will be described in detail with reference to the accompanying drawings.

The following embodiments are provided only for illustrative purposes so that the spirit of the present invention can be fully conveyed to those skilled in the art. Therefore, the present invention is not limited to the following embodiments but may be implemented in other forms. In the drawings, widths, lengths, thicknesses and the like of elements are exaggerated for convenience of illustration. Like reference numerals are used to designate like elements.

Figure 2:
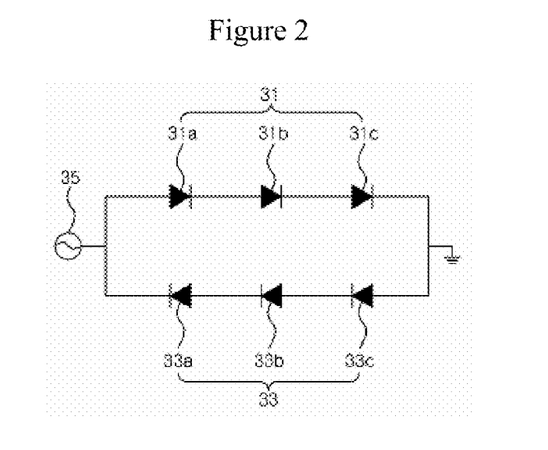
FIGS. 2 and 3 are circuit diagrams illustrating the operational principles of the LED having an AlInGaP active layer according to embodiments of the present invention.
Figure 3:
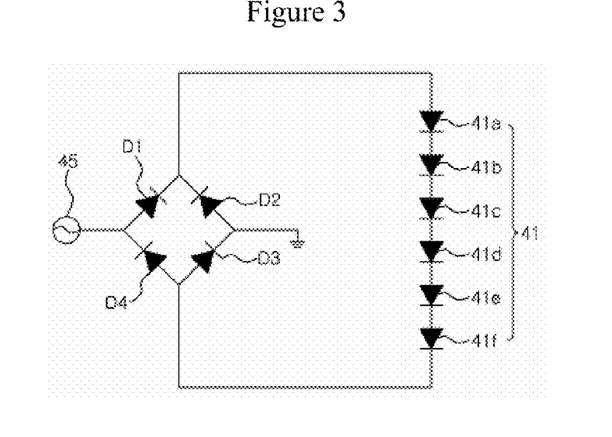

FIGS. 2 and 3 are circuit diagrams illustrating the operational principles of LEDs according to the embodiments of the present invention.

Referring to FIG. 2, light emitting cells 31a, 31b and 31c are connected in series to form a first serial light emitting cell array 31, and other light emitting cells 33a, 33b and 33c are connected in series to form a second serial light emitting cell array 33. Here, the "serial light emitting cell array" means a structure in which a plurality of light emitting cells are connected in series.

Both ends of each of the first and second serial arrays 31 and 33 are connected to an AC power source 35 and a ground, respectively. The first and second serial arrays 31 and 33 are connected in parallel between the AC power source 35 and the ground. That is, the first and second serial arrays 31 and 33 are electrically connected to each other at both ends thereof.

Meanwhile, the first and second serial arrays 31 and 33 are disposed such that the light emitting cells therein are driven by currents flowing in opposite directions to each other. That is, as shown in this figure, anodes and cathodes of the light emitting cells included in the first serial array 31 are disposed in an opposite direction to anodes and cathodes of the light emitting cells included in the second serial array 32.

Thus, when the AC power source 35 has a positive phase, the light emitting cells included in the first serial array 31 are turned on to emit light, and the light emitting cells included in the second serial array 33 are turned off. On the contrary, when the AC power source has a negative phase, the light emitting cells included in the first serial array 31 are turned off, and the light emitting cells included in the second serial array 33 are turned on.

Consequently, the first and second serial arrays 31 and 33 are repeatedly turned on and off, and thus the light emitting device including the first and second serial arrays 31 and 33 continuously emits light.

Although light emitting chips, each of which consists of a single light emitting diode, are connected as the circuit of FIG. 2 to drive the light emitting chips using an AC power source, a space occupied by the light emitting chips increases. However, since the light emitting device of the present invention can be driven by connecting an AC power source to a single chip, a space occupied by the light emitting device does not increase.

Meanwhile, the circuit of FIG. 2 is configured such that both ends of each of the first and second serial arrays 31 and 33 are connected to the AC power source 35 and the ground, respectively. However, the circuit may be configured such that both ends of each of the first and second serial arrays 31 and 33 are connected to both ends of the AC power source 35. Further, each of the first and second serial arrays 31 and 33 is configured to have the three light emitting cells. However, this is for convenience of illustration, and the number of light emitting cells may be more increased as necessary. The number of serial arrays may also be more increased.

Referring to FIG. 3, light emitting cells 41a, 41b, 41c, 41d, 41e and 41f constitute a serial light emitting cell array 41. Meanwhile, a bridge rectifier including light emitting cells D1, D2, D3 and D4 is disposed between an AC power source 45 and the serial light emitting cell array 41 and between a ground and the serial light emitting cell array 41. An anode terminal of the serial light emitting cell array 41 is connected to a node between the light emitting cells D1 and D2, and a cathode terminal of the serial light emitting cell array 41 is connected to a node between the light emitting cells D3 and D4. Meanwhile, a terminal of the AC power source 45 is connected to a node between the light emitting cells D1 and D4, and the ground is connected to a node between the light emitting cells D2 and D3.

When the AC power source has a positive phase, the light emitting cells D1 and D3 of the bridge rectifier are turned on and the light emitting cells D2 and D4 of the bridge rectifier are turned off. Hence, current flows into the ground via the light emitting cell D1 of the bridge rectifier, the serial light emitting cell array 41 and the light emitting cell D3 of the bridge rectifier.

Meanwhile, when the AC power source 45 has a negative phase, the light emitting cells D1 and D3 of the bridge rectifier are turned off and the light emitting cells D2 and D4 of the bridge rectifier are turned on. Hence, current flows into the AC power source 45 via the light emitting cell D2 of the bridge rectifier, the serial light emitting cell array 41 and the light emitting cell D4 of the bridge rectifier.

Consequently, the bridge rectifier is connected to the serial light emitting cell array 41, so that the serial light emitting cell array 41 can be continuously driven using the AC power source 45. Here, although the bridge rectifier is configured such that its terminals are connected to the AC power source 45 and the ground, the bridge rectifier may be configured such that both the terminals thereof are connected to both terminals of the AC power source 45.

According to this embodiment, a single serial light emitting cell array is electrically connected to an AC power source to be driven, and the efficiency of light emitting cells can be more enhanced as compared with the light emitting device of FIG. 2.

Figure 4:
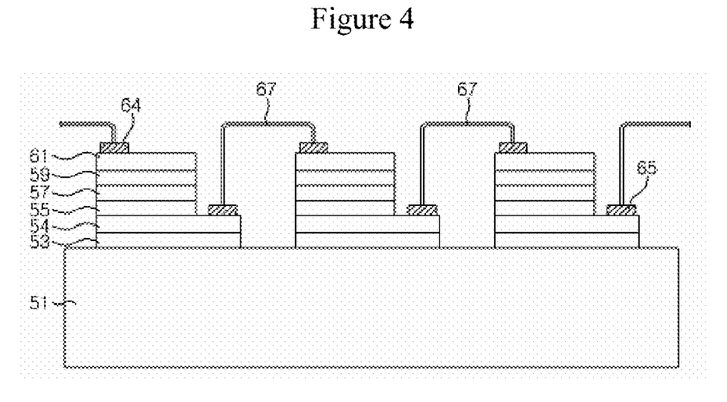
FIG. 4 is a sectional view illustrating an LED having an AlInGaP active layer according to an embodiment of the present invention.

FIG. 4 is a sectional view of an LED having an AlInGaP active layer according to an embodiment of the present invention.

Referring to FIG. 4, the LED includes a conductive substrate 51. The conductive substrate is a single crystalline substrate suitable for growing AlInGaP epitaxial layers, preferably, may be a GaAs substrate.

A plurality of light emitting cells spaced apart from one another are disposed on the conductive substrate 51. Each of the light emitting cells comprises a first conductive-type lower semiconductor layer 55, an AlInGaP active layer 57 and a second conductive-type upper semiconductor layer 59. The lower and upper semiconductor layers 55 and 59 may be formed of a material with a bandgap larger than the active layer 57 and formed of an AlInGaP compound semiconductor. Further, the active layer 57 may be formed in a single or multiple quantum well structure.

Meanwhile, a first conductive-type contact layer 54 may be disposed under the first conductive-type lower semiconductor layer 55, and a region of the first conductive-type contact layer 54 is exposed. The first conductive-type contact layer 54 may be formed of a material with specific resistivity lower than the first conductive-type lower semiconductor layer 55. Alternatively, the first conductive-type contact layer 54 may be formed of the same material as the first conductive-type lower semiconductor layer 55. In this case, an interface between the contact layer 54 and the lower semiconductor layer 55 disappears.

The second conductive-type upper semiconductor layer 59 is positioned over a portion of the contact layer 54, and the active layer is interposed between the upper and lower semiconductor layers 59 and 55. Further, a window layer 61 may be formed on the upper semiconductor layer 59. The window layer may be formed of a material such as GaAsP, AlGaAs or GaP, and is formed of a transparent material with specific resistivity lower than the upper semiconductor layer 59. The window layer 61 may be grown on the upper semiconductor layer 59 using an epitaxial growth technique. Further, the window layer may be formed of a material with a bandgap broader than the AlInGaP active layer 57. However, in order to reduce forward voltage (Vf), the window layer may be formed of a material, e.g., AlInGaP, with the same bandgap as the active layer 57.

Meanwhile, semi-insulating layers 53 are interposed between the conductive substrate 51 and the light emitting cells. Although the semi-insulating buffer layers 53 may be discontinuous as shown in the figure, they are not limited thereto but may extend to be continuous.

The semi-insulating buffer layers 53 may be formed of III-V based material with high specific resistivity without being doped or III-V based material doped with electron acceptors. The electron acceptor may be a metal with a monovalent or divalent ion, and may be an alkali metal, an alkali earth metal and/or a transition metal. For example, the electron acceptor may be Fe or Cr ions. In general, compound semiconductor layers grown without artificial doping indicate N-type conductive. The electron acceptors accept electrons in such compound semiconductor layers, thereby increasing specific resistivity to form a semi-insulating layer.

Meanwhile, wires 67 electrically connect the light emitting cells to one another. Each of the wires 67 connects the contact layer 54 of the light emitting cell and the window layer 61 of the adjacent light emitting cell thereto. As shown in this figure, each wire 67 may connect an ohmic contact layer 64 formed on the window layer 61 and an ohmic contact layer 65 formed on the exposed region of the first conductive-type contact layer 54. Here, the wires 67, which are formed through an air bridge process, are physically separated from the conductive substrate 51 and the light emitting cells except the contact portions.

At least two serial light emitting cell arrays can be formed on the conductive substrate 51 through the wires 67. The serial light emitting cell arrays are disposed to be driven by currents flowing in opposite directions to each other. Further, a bridge rectifier may be disposed on the conductive substrate 51 together with a serial light emitting cell array. Accordingly, the LED can be driven by being connected directly to an AC power source.

Figure 5:
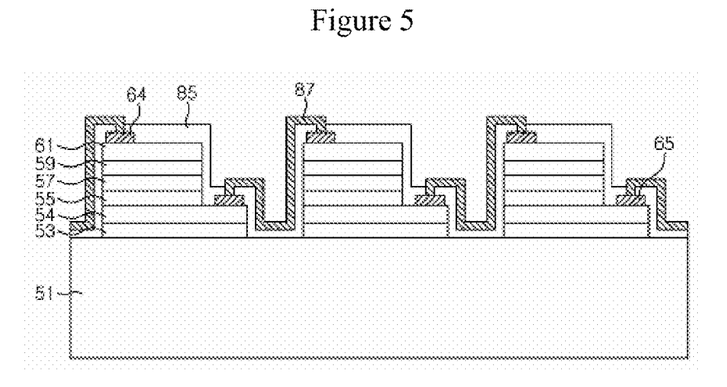
FIG. 5 is a sectional view illustrating an LED having an AlInGaP active layer according to another embodiment of the present invention.

FIG. 5 is a sectional view of an LED according to another embodiment of the present invention.

Referring to FIG. 5, the LED according to this embodiment has the same configuration as the LED of FIG. 4 except a wiring structure of connecting light emitting cells. That is, wires 87 according to this embodiment are formed through a step cover process. To this end, all layers of the light emitting cells and a substrate 51 are covered with an insulating layer 85 except portions for contacting the wires 87. Further, the wires 87 are patterned on the insulating layer 85, thereby electrically connecting the light emitting cells.

For example, the insulating layer 85 has openings for exposing ohmic contact layers 64 and 65, and the wires 87 connect the ohmic contact layers 64 and 65 of the adjacent light emitting cells to each other through the openings, thereby connecting the light emitting cells in series.

Figure 6:
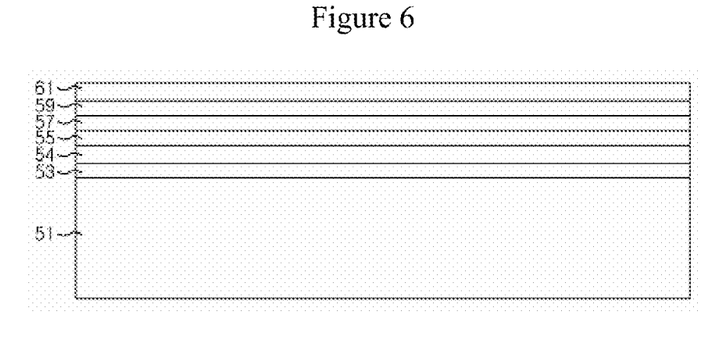
FIGS. 6 to 8 are sectional views illustrating a method of fabricating the LED having the AlInGaP active layer according to the embodiment of the present invention.
Figure 7:
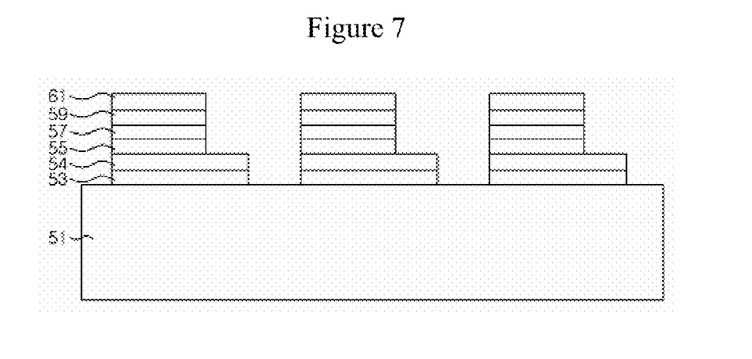
Figure 8:
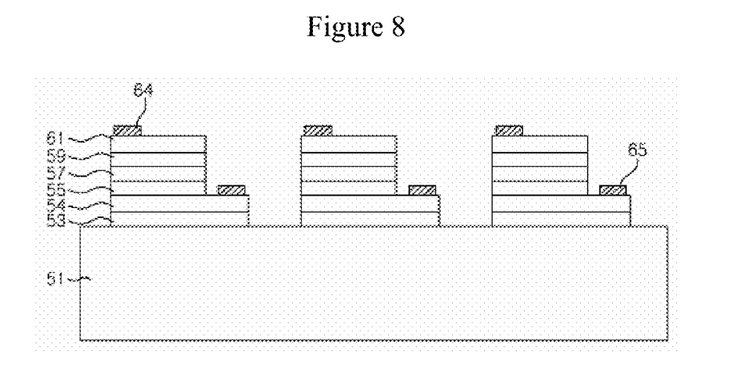

FIGS. 6 to 8 are sectional views illustrating a method of fabricating an LED according to the embodiment of the present invention.

Referring to FIG. 6, a semi-insulating buffer layer 53, a first conductive-type lower semiconductor layer 55, an AlInGaP active layer 57 and a second conductive-type upper semiconductor layer 59 are grown on a conductive substrate 51. Further, a first conductive-type contact layer 54 may be formed on the semi-insulating buffer layer 53, and a window layer 61 may be formed on the second conductive-type upper semiconductor layer 59.

The conductive substrate 51, which is a single crystalline substrate having a lattice constant suitable for growing an AlInGap epitaxial layer, may be a GaAs or GaP substrate. Meanwhile, the semi-insulating buffer layer 53 may be formed by a metal organic chemical vapor deposition (MOCVD) or molecular beam epitaxy (MBE) method. The semi-insulating buffer layer 53 may be an AlInGaP based material or III-V based material with a lattice constant similar to the AlInGaP based material.

Meanwhile, while being formed, the semi-insulating buffer layer 53 may be doped with electron acceptors. The electron acceptor may be a metal with a monovalent or divalent ion, and may be an alkali metal, an alkali earth metal and/or a transition metal. For example, the electron acceptor may be Fe or Cr ions.

In the meantime, the semi-insulating buffer layer 53 need not be doped throughout its thickness with electron acceptors. The semi-insulating buffer layer 53 having low specific resistivity can be formed by being doped through a certain depth thereof with electron acceptors.

The first conductive-type contact layer 54 may be formed of an AlInGaP compound semiconductor, and preferably formed of a material with low specific resistivity for the purpose of current distribution. Meanwhile, all the first conductive-type lower semiconductor layer 55 and the second conductive-type upper semiconductor layer 59 may be formed of AlInGaP compound semiconductor, and are formed of a material with a bandgap larger than the active layer 57 by adjusting a composition ratio of Al, Ga and/or In. All the lower and upper semiconductor layers 55 and 59 and the active layer 57 may be formed by a MOCVD or MBE method.

Meanwhile, the window layer 61 may be formed a transparent material layer with low specific resistivity, e.g., GaAsP, AlGaAs or GaP. Alternatively, the window layer 61 may be formed of a material, e.g., AlInGaP, with the same bandgap as the active layer 57. The window layer 61 may be grown on the upper semiconductor layer 59 by an epitaxial growth technique. When the window layer 61 is formed of a material with the same bandgap as the active layer 57, it is possible to lower forward voltage (Vf).

Referring to FIG. 7, the window layer 61, the second conductive-type upper semiconductor layer 59, the active layer 57, the first conductive-type lower semiconductor layer 55, the first conductive-type contact layer 54 and the semi-insulating buffer layer 53 are patterned to thereby separate light emitting cells from one another and expose regions of the first conductive-type contact layer 54. As a result, light emitting cells with the first conductive-type contact layer 54 exposed are formed.

Referring to FIG. 8, an ohmic contact layer 64 is formed on the window layer 61, and an ohmic contact layer 65 is formed on the exposed regions of the first conductive-type contact layer 54. The ohmic contact layer 64 is ohmic-contacted to the window layer 61, and the ohmic contact 65 is ohmic-contacted to the first conductive-type contact layer 54.

Subsequently, wires 67 (see FIG. 4) for electrically connecting the light emitting cells are formed through an air bridge process. The wires 67 connect the light emitting cells to form a serial light emitting cell array. At least two serial light emitting cell arrays may be formed on the conductive substrate 51, wherein the serial light emitting cell arrays are disposed to be driven by currents flowing in opposite directions to each other. Alternatively, a bridge rectifier including light emitting cells may be formed on the conductive substrate 51 together with a serial light emitting cell array. Accordingly, an LED which can be driven by being connected to an AC power source without an AC-to-DC converter is completed.

Meanwhile, the wires 67 for connecting the light emitting cells may be formed by a step cover method, and thus, the LED of FIG. 5 is completed. That is, after the ohmic contact layers 64 and 65 of FIG. 8 are formed, the insulating layer 85 (see FIG. 5) is formed on an entire surface of the conductive substrate 51. The insulating layer 85 may be formed of, for example, $SiO_2$. Subsequently, the insulating layer 85 is patterned to form openings for exposing the ohmic contact layers 64 and 65. Thereafter, wires 87 are formed on the insulating layer 85 by a plating or deposition technique to electrically connect the light emitting cells.

Figure 9:
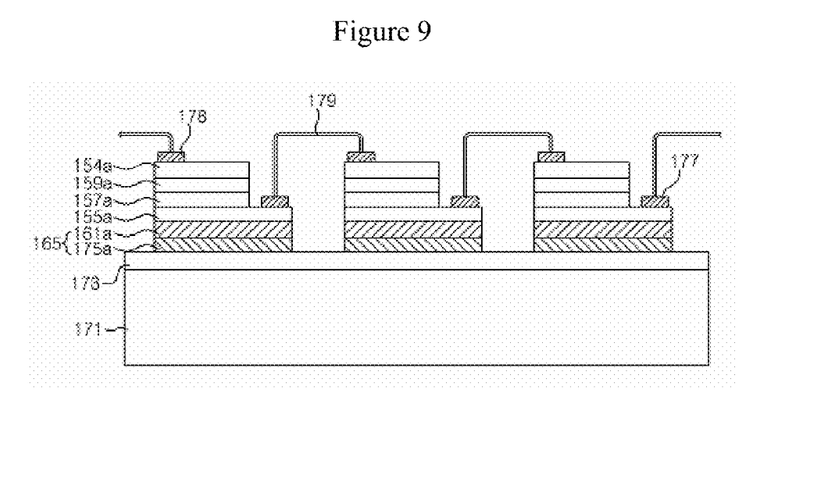
FIG. 9 is a sectional view illustrating an LED having an AlInGaP active layer according to a further embodiment of the present invention.

FIG. 9 is a sectional view of an LED according to a further embodiment of the present invention.

Referring to FIG. 9, the LED includes a base substrate 171. The base substrate 171 need not be a single crystalline substrate suitable for growing AlInGaP epitaxial layers, but may be a conductive substrate such as a metal substrate or GaP substrate.

A plurality of metal patterns 165 are disposed on the base substrate 171 to be spaced apart from one another. An insulating layer 173 is interposed between the base substrate and the metal patterns, thereby electrically insulating the metal patterns 165 from the base substrate 171. Light emitting cells are positioned on the metal patterns 165, respectively. Each of the light emitting cells comprises a first conductive-type lower semiconductor layer 155a, an AlInGaP active layer 157a and a second conductive-type upper semiconductor layer 159a.

The lower and upper semiconductor layers 155a and 159a are formed of a material with bandgap larger than the active layer 157a, and may be formed of an AlInGaP compound semiconductor. Further, the active layer 157a may be formed in a single or multiple quantum well structure.

Meanwhile, the upper semiconductor layer 159a is respectively positioned on a portion of the lower semiconductor layer 155a such that a region of the lower semiconductor layer 155a is exposed, as shown in this figure, and the active layer 157a may be interposed between the lower and upper semiconductor layers 155a and 159a. Alternatively, the semiconductor layers may be respectively positioned on portions of the metal patterns 165 such that regions of the metal patterns 165 are exposed.

In the meantime, a window layer 154a can be formed on the second conductive-type upper semiconductor layer 159a. The window layer 154a may be formed of a material such as GaAsP, AlGaAs or GaP, and is formed of a transparent material with specific resistivity lower than the upper semiconductor substrate 159a. The window layer 154a may be grown by an epitaxial growth technique. The window layer 154a may be formed of a material with a bandgap broader than the AlInGaP active layer 157a, or the window layer 154a may be formed of a material with the same bandgap as the active layer 157a in order to reduce forward voltage (Vf).

Meanwhile, wires 179 electrically connect the light emitting cells to one another. Each of the wires 179 connects the lower semiconductor layer 155a of the light emitting cell and the window layer 154a of the adjacent light emitting cell thereto. As shown in this figure, each of the wires 179 can connect an ohmic contact layer 178 formed on the window layer 154a and an ohmic contact layer 177 formed on the exposed region of the first conductive-type lower semiconductor layer 155a to each other. Meanwhile, when the metal patterns 165 are exposed, the wires 179 can connect the ohmic contact layer 178 and the metal patterns 165, respectively. Here, the wires 179, which are formed through an air bridge process, are physically separated from the base substrate 171 and the light emitting cells except the contact portions.

At least two serial light emitting cell arrays can be formed on the base substrate 171 through the wires 179. The serial light emitting cell arrays are disposed to be driven by currents flowing in opposite directions to each other. Further, a bridge rectifier may be disposed on the base substrate 171 together with a serial light emitting cell array. Accordingly, the LED can be driven by being connected to an AC power source.

Figure 10:
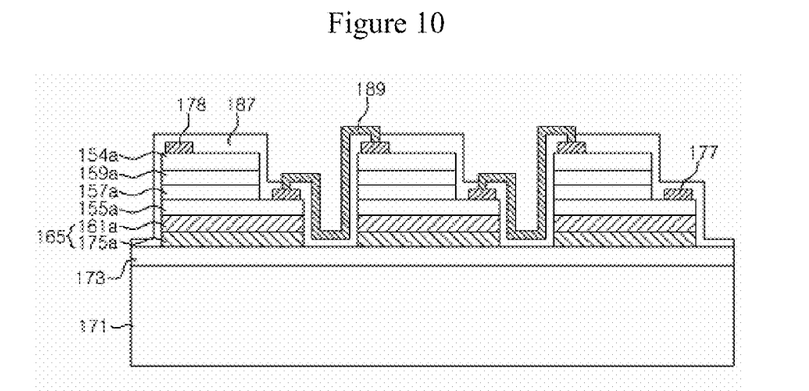
FIG. 10 is a sectional view illustrating an LED having an AlInGaP active layer according to a still further embodiment of the present invention.

FIG. 10 is a sectional view of an LED according to a still further embodiment of the present invention.

Referring to FIG. 10, the LED according to this embodiment has the same configuration as the LED of FIG. 9 except a wiring structure for connecting light emitting cells. That is, wires 189 according to this embodiment are formed through a step cover process. To this end, all layers of the light emitting cells and a base substrate 171 are covered with an insulating layer 187 except portions for contacting the wires 189. Further, the wires 189 are patterned on the insulating layer 187, thereby electrically connecting the light emitting cells.

For example, the insulating layer 187 has openings for exposing ohmic contact layers 178 and 177 or metal patterns 165, and the wires 189 connect the adjacent light emitting cells to each other through the openings.

FIGS. 11 to 14 are sectional views illustrating a method of fabricating an LED having an AlInGaP active layer according to the further embodiment of the present invention.

Figure 11:
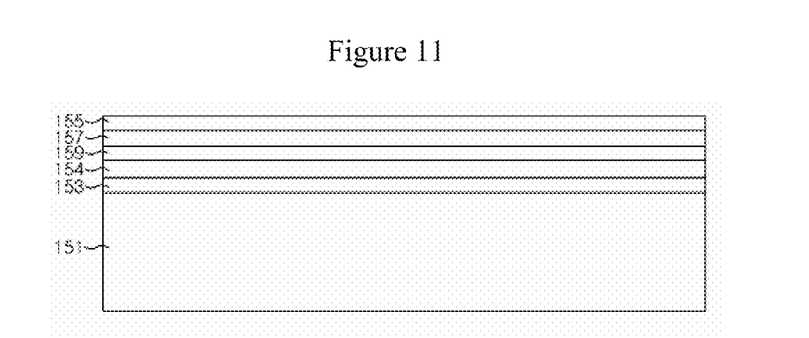
FIGS. 11 to 14 are sectional views illustrating a method of fabricating the LED having the AlInGaP active layer according to the further embodiment of the present invention.

Referring to FIG. 11, semiconductor layers including a first conductive-type semiconductor layer 155, a second conductive-type semiconductor layer 159 and an AlInGaP active layer 157 interposed between the first and second conductive-type semiconductor layers are formed on a sacrificial substrate 151. Further, the semiconductor layers may include a buffer layer 153 formed on the sacrificial substrate 151, and a window layer can be formed before forming the second conductive-type semiconductor layer 159.

The substrate 151, which is a single crystalline substrate having a lattice constant suitable for growing an AlInGaP epitaxial layer, may be a GaAs or GaP substrate. Meanwhile, the buffer layer 153 may be formed by a MOCVD or MBE method. The buffer layer 153 may be an AlInGaP based material or III-V based material with a lattice constant similar to the AlInGaP based material.

Meanwhile, all the first and second conductive-type semiconductor layers 155 and 159 may be formed of an AlInGaP compound semiconductor, and are formed of a material with a bandgap larger than the active layer 157 by adjusting a composition ratio of Al, Ga and/or In. All the first and second semiconductor layers 155 and 159 and the active layer 157 may be formed by a MOCVD or MBE method.

The window layer 154 may be formed a material layer, e.g., GaAsP, AlGaAs or GaP, with low specific resistivity while transmitting light generated in the active layer 157. In order to reduce forward voltage (Vf), the window layer 154 may be formed of a material with the same bandgap as the active layer 157. The window layer 154 may be grown by an epitaxial growth technique before growing the second conductive-type semiconductor layer 159.

Figure 12:
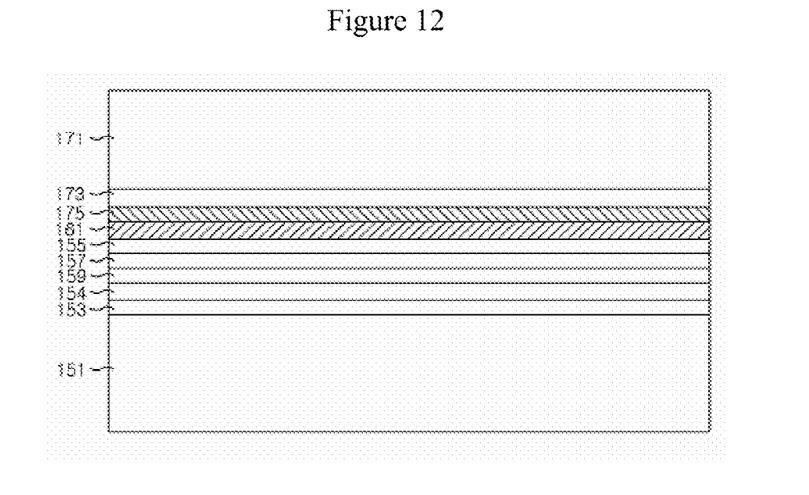

Referring to FIG. 12, a base substrate 171 is prepared separately from the sacrificial substrate 151, and an insulating layer 173 is formed on the base substrate 171. The base substrate 171 is selected to enhance the light emitting efficiency of the LED. In particular, the base substrate 171 may be an electrically conductive substrate with high thermal conductivity. In some embodiments, the base substrate 171 may be a transparent substrate. The insulating layer 173 may be an oxide layer, such as $SiO_2$, or a semi-insulating layer.

Subsequently, the insulating layer 173 and the semiconductor layers are bonded to face each other. The insulating layer 173 may be bonded directly to the semiconductor layers. Alternatively, the insulating layer 173 may be bonded to the semiconductor layers by interposing an adhesive metal layer 175 therebetween. Further, a reflective metal layer 161 such as Ag or Al may be interposed between the adhesive metal layer 175 and the semiconductor layers. The adhesive metal layer 175 may be formed on the semiconductor layers and/or the insulating layer 173, and the reflective metal layer 161 may be formed on the semiconductor layers. Further, an anti-diffusion layer may be interposed between the adhesive metal layer 175 and the reflective metal layer 161. The anti-diffusion layer prevents diffusion of a metal element from the adhesive metal layer 175 to the reflective metal layer 161 and therefore reduction of reflectivity of the reflective metal layer 161.

Figure 13:
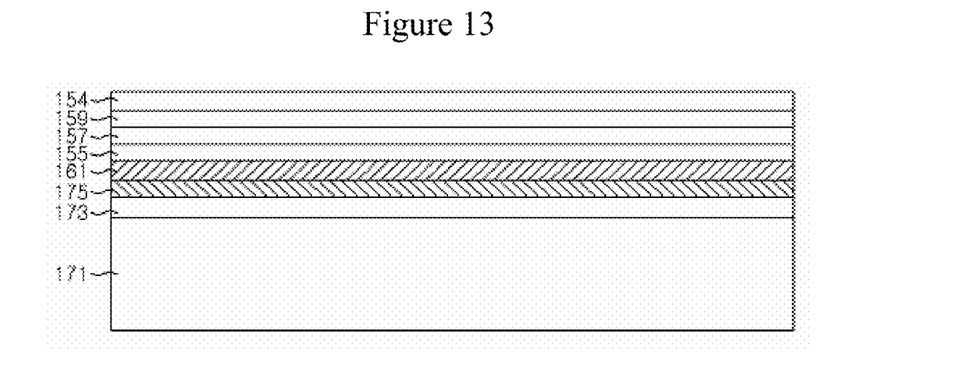

Referring to FIG. 13, the sacrificial substrate 151 is separated from the semiconductor layers. The sacrificial substrate 151 can be separated through wet or dry etching, polishing, ion milling or combination thereof. At this time, the buffer layer 153 may also be removed together.

The sacrificial substrate 151 may be separated after bonding the semiconductor layers, but the present invention is not limited thereto. The sacrificial substrate 151 may be separated before bonding the insulating layer 173 and the semiconductor layers. In this case, the insulating layer 173 may be bonded to the semiconductor layer positioned at a side separated from the sacrificial substrate 151. Further, after bonding another sacrificial substrate (not shown) to the semiconductor layers, the sacrificial substrate 151 is removed, and the insulating layer 173 of the base substrate 171 is bonded to the semiconductor layers. Thereafter, the another sacrificial substrate is separated. Meanwhile, when the insulating layer 173 is bonded to the semiconductor layer at a side separated from the sacrificial substrate 151, the window layer 154 is formed to be positioned on the first conductive-type semiconductor layer 155.

Figure 14:
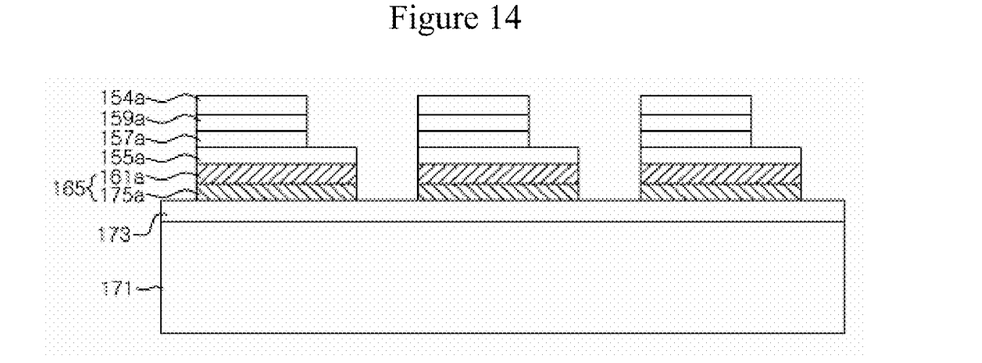

Referring to FIG. 14, the semiconductor layers are patterned to form a plurality of light emitting cells spaced apart from one another. Each of the light emitting cells comprises the patterned first conductive-type lower semiconductor layer 155a, AlInGaP active layer 157a and second conductive-type semiconductor layer 159a, and may include the patterned window layer 154a. The semiconductor layers may be patterned by a photolithography and etching technique.

Meanwhile, when the adhesive metal layer 161 and/or the reflective metal layer 175 are interposed between the insulating layer 173 and the semiconductor layers, they are also patterned to form metal patterns 165 spaced apart from one another. As shown in this figure, the patterned first conductive-type lower semiconductor layer 155a may be formed such that a region thereof is exposed. However, when the metal patterns 165 are formed, regions of the metal patterns 165 may be exposed, and the region of the first conductive-type lower semiconductor layer 155a need not to be exposed.

Referring back to FIG. 9, an ohmic contact layer 178 is formed on the window layer 154, and an ohmic contact layer 177 is formed on the exposed first conductive-type lower semiconductor layer 155a. The ohmic contact layer 178 is ohmic-contacted to the window layer 154a, and the ohmic contact layer 177 is ohmic-contacted to the first conductive-type lower semiconductor layer 155a. Meanwhile, when regions of the metal patterns 165 are exposed, the ohmic contact layer 177 may be omitted. In such a case, the metal patterns 165 are preferably ohmic-contacted to the first conductive-type lower semiconductor layer 155a.

Subsequently, wires 179 for electrically the light emitting cells are formed through an air bridge process. The wires 179 connect the light emitting cells to form a serial light emitting cell array. At least two serial light emitting cell arrays may be formed on the base substrate 171. The serial light emitting cell arrays are disposed to be driven by current flowing in opposite direction to each other. Alternatively, a bridge rectifier including light emitting cells may be formed on the base substrate 171 together with a serial light emitting cell array. Accordingly, an LED which can be driven by being connected to an AC power source without an AC-to-DC converter is completed.

Meanwhile, the wires 179 for connecting the light emitting cells may be formed by a step cover method, and thus, the LED of FIG. 10 is completed. That is, after the ohmic contact layers 177 and 178 are formed, the insulating layer 187 is formed on an entire surface of the base substrate 171. The insulating layer 187 may be formed of, for example, $SiO_2$. Subsequently, the insulating layer 187 is patterned to form openings for exposing the ohmic contacts 177 and 178. Thereafter, wires 189 are formed on the insulating layer 187 by a plating or deposition technique to electrically connect the light emitting cells.

The invention claimed is:

1. A light emitting diode, comprising:
a substrate;
a plurality of metal patterns arranged on the substrate and spaced apart from one another, each of the metal patterns consisting of metal layers;
a plurality of light emitting cells arranged directly on the metal patterns, respectively, the light emitting cells consisting of III-V based semiconductor layers and being spaced apart from one another, each of the light emitting cells comprising a first conductive-type lower semiconductor layer, an AlInGaP active layer, and a second conductive-type upper semiconductor layer;
a semi-insulating or insulating layer disposed between the substrate and the metal patterns; and
wires to connect the plurality of light emitting cells in series,
wherein each of the plurality of metal patterns comprises an adhesive metal layer and a reflective metal layer, and the reflective metal layer is interposed between the light emitting cell and the adhesive metal layer, and the reflective metal layer and the adhesive metal layer comprise different materials from each other, and
wherein the plurality of light emitting cells are positioned directly on the reflective metal layer.

2. The light emitting diode as claimed in claim 1, wherein the semi-insulating or insulating layer is continuous.

3. The light emitting diode as claimed in claim 1, wherein the substrate is a metal substrate or GaP substrate.

4. The light emitting diode as claimed in claim 1, wherein each of the plurality of light emitting cells further comprises a window layer arranged on the second conductive-type upper semiconductor layer.

5. The light emitting diode as claimed in claim 4, wherein the window layer comprises at least one layer selected from the group consisting of GaAsP, AlGaAs, and GaP.

6. The light emitting diode as claimed in claim 4, wherein the window layer comprises the same bandgap as the AlInGaP active layer.

7. The LED as claimed in claim 4, wherein the window layer is grown by an epitaxial growth technique.

8. The light emitting diode as claimed in claim 1, wherein the semi-insulating layer comprises a III-V based material doped with electron acceptors.

9. The light emitting diode as claimed in claim 8, wherein the electron acceptor comprises at least one material selected from the group consisting of an alkali metal, an alkali earth metal, and a transition metal.

10. The light emitting diode as claimed in claim 1, wherein the active layer and the upper semiconductor layer are arranged over a portion of the lower semiconductor layer such that a region of the lower semiconductor layer of each of the light emitting cells is exposed, and each of the wires connects the exposed region of the lower semiconductor layer in each of the light emitting cells and the upper semiconductor layer of the adjacent light emitting cell thereto.

11. The light emitting diode as claimed in claim 1, wherein the light emitting cells are respectively arranged on portions of the metal patterns such that a region of each of the metal patterns may be exposed, and each of the wires connects the exposed region of the metal pattern and the upper semiconductor layer of the light emitting cell adjacent thereto.

12. The light emitting diode as claimed in claim 1, wherein the light emitting cells are connected through the wires to form at least two serial arrays, the at least two serial arrays being connected to each other in reverse parallel.

13. The light emitting diode as claimed in claim 1, further comprising light emitting cells comprising a bridge rectifier, the bridge rectifier arranged on the substrate and connected to the light emitting cells connected.

* * * * *